(12) United States Patent
Wang

(10) Patent No.: US 8,238,111 B2
(45) Date of Patent: Aug. 7, 2012

(54) PRINTED CIRCUIT BOARD

(75) Inventor: Cheng-Sung Wang, Taipei-Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 183 days.

(21) Appl. No.: 12/843,063

(22) Filed: Jul. 26, 2010

(65) Prior Publication Data
US 2012/0020043 A1 Jan. 26, 2012

(51) Int. Cl.
*H05K 7/00* (2006.01)
*H01R 9/00* (2006.01)

(52) U.S. Cl. ........ 361/760; 361/772; 361/774; 361/782; 361/783

(58) Field of Classification Search ........................ None
See application file for complete search history.

(56) References Cited

U.S. PATENT DOCUMENTS

| | | | |
|---|---|---|---|
| 5,912,809 A * | 6/1999 | Steigerwald et al. | 361/780 |
| 6,324,755 B1 * | 12/2001 | Borkowski et al. | 29/840 |
| 7,778,039 B2 * | 8/2010 | Chen et al. | 361/763 |
| 2008/0230258 A1 * | 9/2008 | Shen et al. | 174/251 |
| 2009/0028491 A1 * | 1/2009 | Fillion et al. | 385/14 |

* cited by examiner

*Primary Examiner* — Boris Chervinsky
(74) *Attorney, Agent, or Firm* — Altis Law Group, Inc.

(57) ABSTRACT

A printed circuit board includes a signal layer, a power layer, and a ground layer. The signal layer includes an analog audio input/output (I/O) port and an audio chip. The audio chip includes a main body, a first group of signal pins connected to the analog audio I/O port and a second group of signal pins connected to a control chip. The power layer and the ground layer each is divided into two unconnected parts, an audio part and a digital part, by a dividing groove. The two audio parts act as a whole reference plane for traces between the analog audio I/O port and the first group of signal pins of the audio chip. The two digital parts act as reference planes for traces between the control chip and the second group of signal pins of the audio chip.

4 Claims, 3 Drawing Sheets

PRINTED CIRCUIT BOARD

CROSS-REFERENCE OF RELATED APPLICATION

Relevant subject matters are disclosed in a co-pending U.S. patent application filed on the same date and having the same title, which are assigned to the same assignee as this patent application.

BACKGROUND

1. Technical Field

The present disclosure relates to a printed circuit board (PCB).

2. Description of Related Art

Nowadays, some PCBs, such as computer motherboards, include analog audio input/output (I/O) ports, such as those for a microphone and speaker. The analog audio I/O ports are connected to an audio chip through some audio traces in the PCBs, however, these audio traces easily pick up noise signals from other circuits or reference layers of the PCBs. Furthermore, if the I/O ports are antennas, the noise signals can be emitted through the I/O ports, which can produce electro magnetic interference (EMI) problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references may mean at least one.

Figure 1:
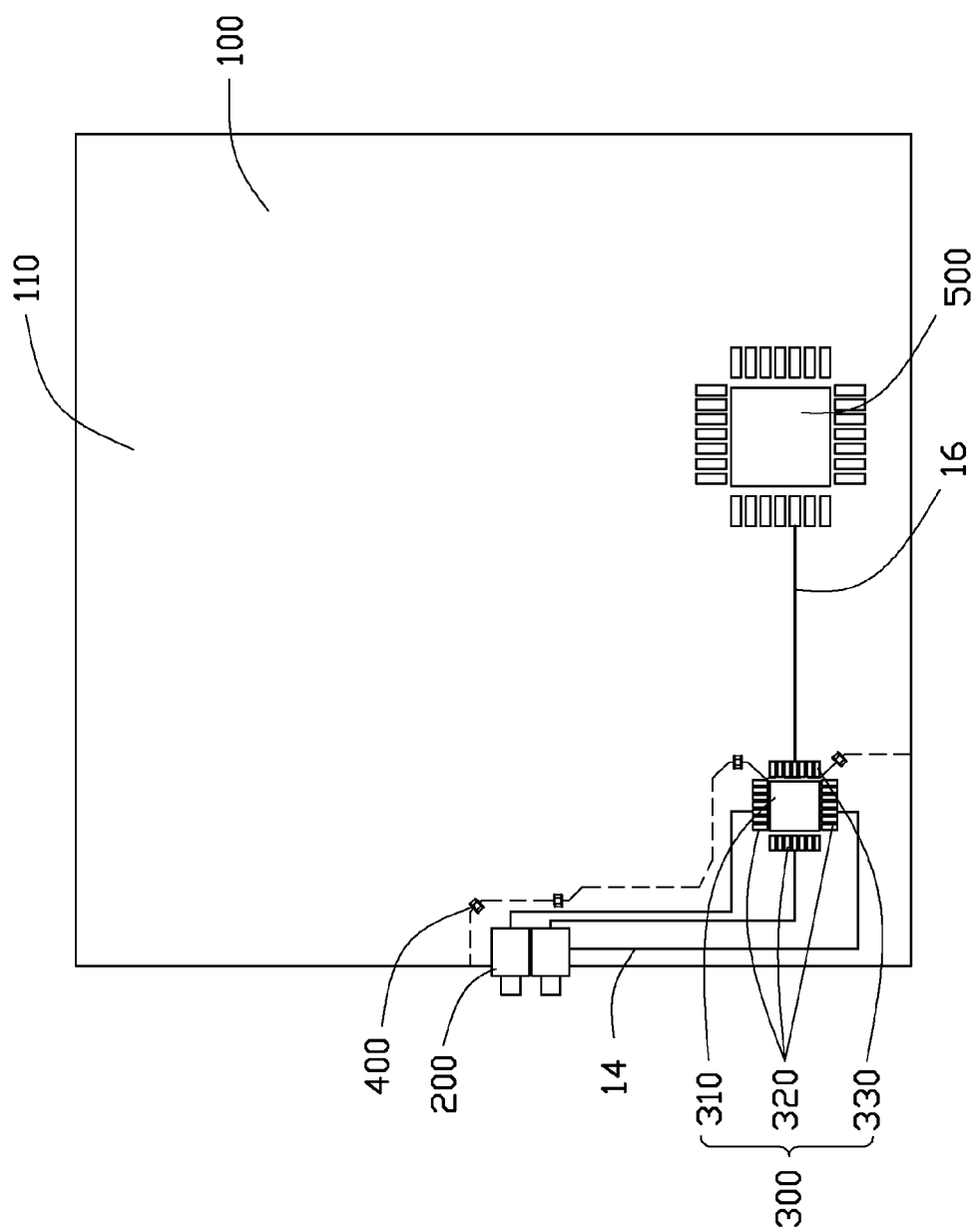
FIG. 1 is a schematic view of an embodiment of a printed circuit board (PCB), the PCB includes a power layer.
Figure 2:
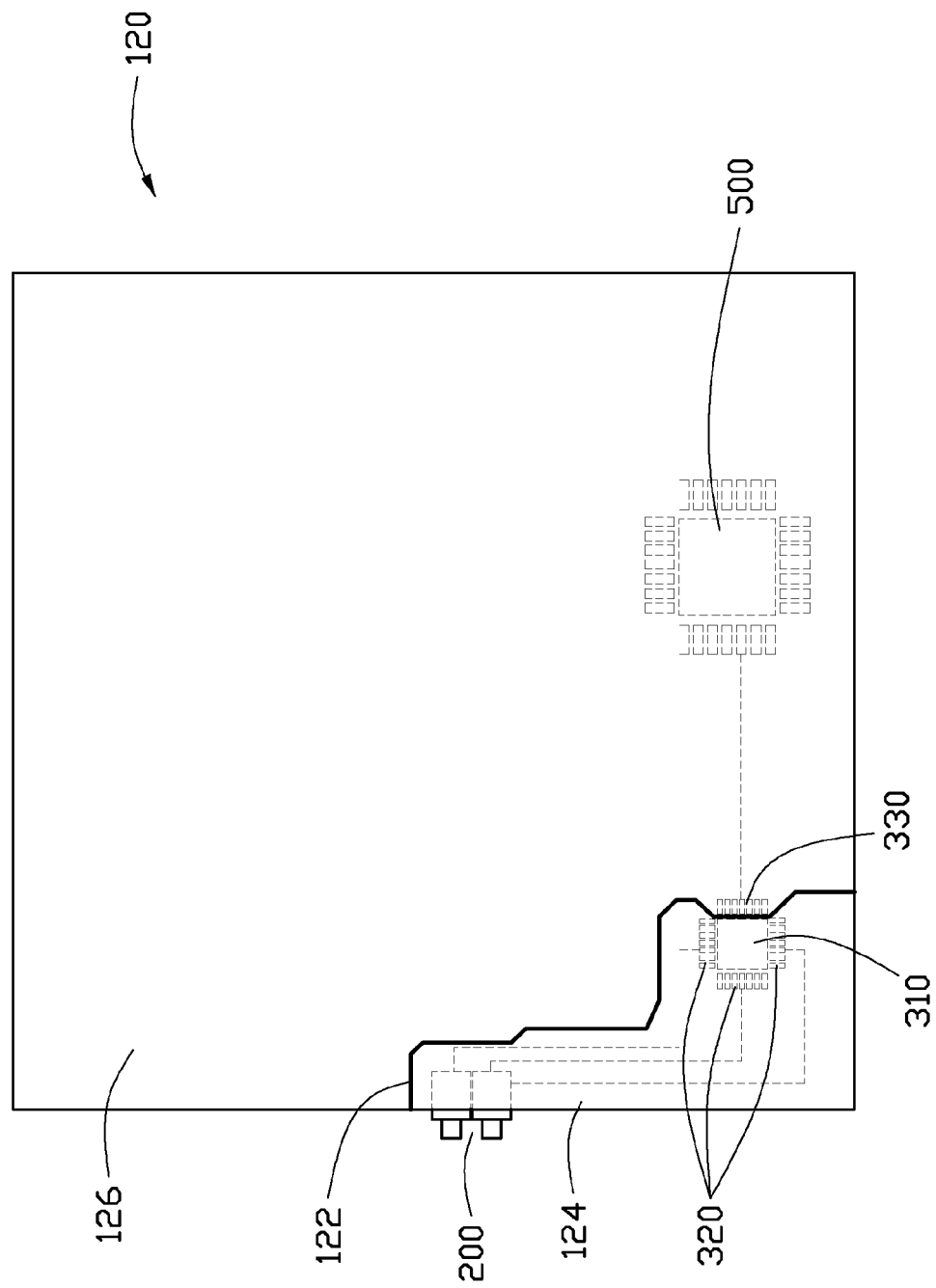
FIG. 2 is a schematic view of the power layer of the PCB of FIG. 1.
Figure 3:
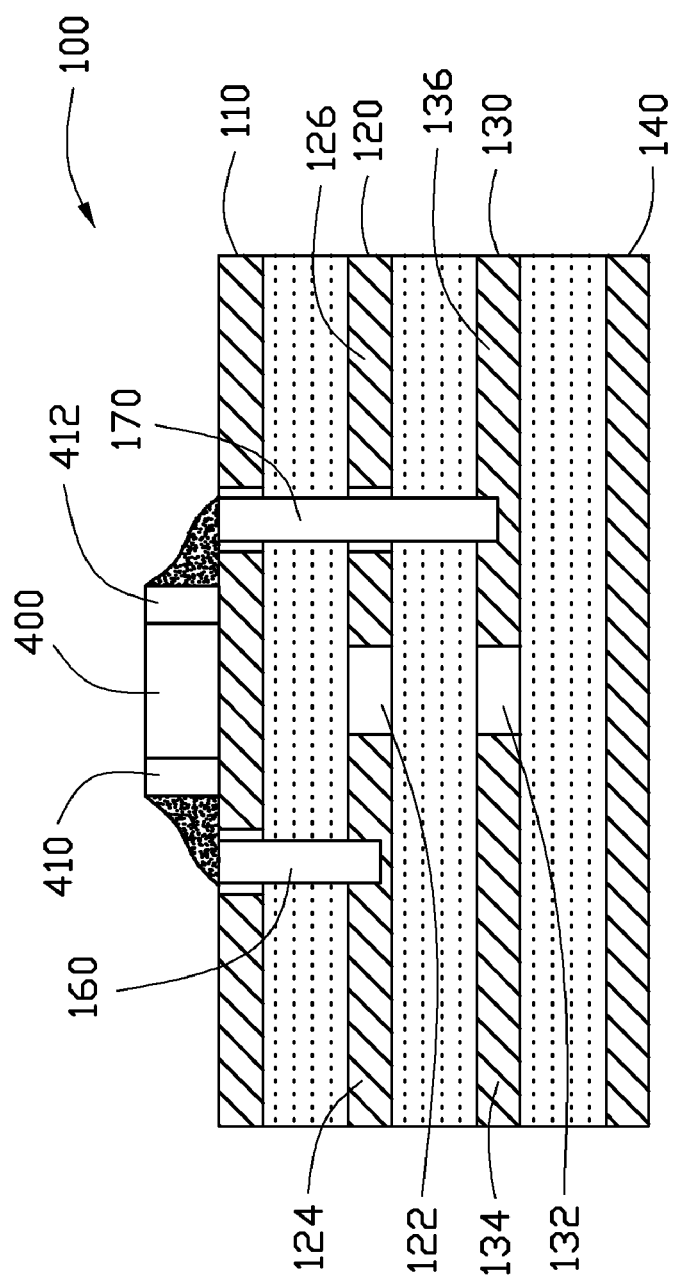
FIG. 3 is a partial, cross-sectional view of the PCB of FIG. 1.

Referring to FIGS. 1 to 3, an embodiment of a printed circuit board (PCB) 100 includes a first signal layer 110, a power layer 120, a ground layer 130, and a second signal layer 140.

The first signal layer 110 includes a pair of analog audio input/output (I/O) ports 200 arranged on one side of the first signal layer 110. An audio chip 300 is installed on the first signal layer 110 adjacent to the ports 200. The audio chip 300 is used to control the ports 200 to transmit or receive signals. The audio chip 300 includes a main body 310 and a plurality of signal pins extending from the main body 310. The signal pins of the audio chip 300 include a first group of signal pins 320 connected to the ports 200 through traces 14, and a second group of signal pins 330 connected to a control chip, such as a south bridge chip 500, through traces 16. It may be understood that the PCB 100 may also include other elements, such as a central processing unit. These other elements fall within well-known technologies, and are therefore not described here.

Referring to FIG. 2, the power layer 120 is divided into two unconnected parts, an audio part 124 and a digital part 126, by a dividing groove 122. The ground layer 130 is also divided in a manner similar to as the power layer 120, and includes an audio part 134 and a digital part 136 divided by a dividing groove 132 (see FIG. 3). The positions of the dividing groove 122 and the dividing groove 132 need to satisfy the following conditions: the audio part 124 and the audio part 134 are as a whole reference plane for the traces between the ports 200 and the audio chip 300, namely the reference plane of the traces 14 connected between the first group of signal pins 320 and the ports 200 is the audio part 124 and the audio part 134. The digital part 126 is a power reference plane for the other elements of the PCB 100. The digital part 136 is a ground reference plane for the other elements of the PCB 100. For example, the power reference plane of the traces 16 is the digital part 126, and the ground reference plane of the traces 16 is the digital part 136.

Referring to FIG. 1 and FIG. 3, the PCB 100 further includes four capacitors 400. Two of the capacitors 400 are installed on the first signal layer 100 adjacent to the ports 200, and the other two of the capacitors 400 are installed on the first signal layer 100 adjacent to the audio chip 300. A first terminal 410 of each capacitor 400 is electrically connected to the audio part 124 through a via 160. A second terminal 412 of each capacitor 400 is electrically connected to the digital part 136 through a via 170. The number of the capacitors 400 can be changed according to requirements. In one embodiment, the capacitance of each of the capacitors 400 is 1000 picofarads (pF).

Each of the power layer 120 and the ground layer 130 of the PCB 100 are divided into two unconnected parts, therefore the reference plane (audio parts 124 and 134) of the traces 14 is isolated from other elements' reference planes (digital parts 126 and 136), which can prevent noise signals coupling to the ports 200. Furthermore, the capacitors 400 can supply routes to conduct the noise signals of the audio part 124 to the digital part 136, which can reduce electro magnetic interference (EMI) emitted by the ports 200.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A printed circuit board (PCB) comprising:

a signal layer comprising an analog audio input/output (I/O) port arranged on one side of the signal layer, and an audio chip arranged adjacent to the analog audio I/O port, wherein the audio chip comprises a main body, a first group of signal pins electrically connected to the analog audio I/O port and a second group of signal pins electrically connected to a control chip;

a power layer divided into two unconnected parts, namely, a first audio part and a first digital part, by a first dividing groove; and a ground layer divided into two unconnected parts, namely, a second audio part and a second digital part, by a second dividing groove;

wherein the two audio parts act as a whole reference plane for traces between the analog audio I/O port and the first group of signal pins of the audio chip, the two digital parts act as reference planes for traces between the control chip and the second group of signal pins of the audio chip.

2. The PCB of claim 1, further comprising at least one capacitor comprising a first terminal and a second terminal, wherein the first terminal of the at least one capacitor is electrically connected to the first audio part of the power layer through a first via, the second terminal of the at least one capacitor is electrically connected to the second digital part of the ground layer through a second via.

3. The PCB of claim 2, wherein the number of the at least one capacitor is four, two of the capacitors are installed adjacent to the analog audio I/O port, and the other two of the capacitors are installed adjacent to the audio chip.

4. The PCB of claim 2, wherein the capacitance of each of the at least one capacitor is 1000 picofarads.

* * * * *